United States Patent [19]
Minton et al.

[11] Patent Number: 5,883,005
[45] Date of Patent: Mar. 16, 1999

[54] SEMICONDUCTOR ETCHING BY HYPERTHERMAL NEUTRAL BEAMS

[75] Inventors: Timothy K. Minton; Konstantinos P. Giapis, both of Pasadena, Calif.

[73] Assignee: California Institute of Technology, Pasadena, Calif.

[21] Appl. No.: 963,520

[22] Filed: Nov. 3, 1997

Related U.S. Application Data

[63] Continuation of Ser. No. 339,072, Nov. 14, 1994, abandoned, which is a continuation-in-part of Ser. No. 217,683, Mar. 25, 1994, abandoned.

[51] Int. Cl.[6] .................... H01L 21/302; H05H 3/00
[52] U.S. Cl. .................... 438/707; 216/65; 250/251; 438/706
[58] Field of Search .................... 156/345; 438/706, 438/707; 216/2, 40, 58, 65; 250/251

[56] References Cited

U.S. PATENT DOCUMENTS

| | | | |
|---|---|---|---|
| 4,091,256 | 5/1978 | Frichtenicht | 219/121 |
| 4,780,608 | 10/1988 | Cross et al. | 250/281 |
| 4,894,511 | 1/1990 | Caledonia et al. | 219/121.51 |
| 4,911,805 | 3/1990 | Ando et al. | 204/164 |
| 5,108,535 | 4/1992 | Ono et al. | 156/345 |
| 5,108,543 | 4/1992 | Suzuki et al. | 156/643 |
| 5,145,554 | 9/1992 | Seki et al. | 156/643 |
| 5,271,800 | 12/1993 | Koontz et al. | 156/643 |

FOREIGN PATENT DOCUMENTS

| | | | |
|---|---|---|---|
| 17638 | 1/1990 | Japan | 156/345 |
| 19333 | 1/1991 | Japan | 156/345 |

OTHER PUBLICATIONS

J. Applied Physics 70 (10) Nov. 15, 1991. "Charging of pattern features during plasma etching." J.C. Arnold and H.H. Sawin, pp. 5314–5317.

Solid State Technology, Jun. 1992. "How Plasma Etching Damages Thin Gate Oxides" Calvin T. Gabriel, James P. McVitie, pp. 81–87.

Solid State Technology, Apr. 1991. "Etching Issues at .35 $\mu$m and Below" Joel M. Cook, Kevin G. Donohoe, pp. 119–124.

Applied Physics Letter 57 (16) Oct. 15, 1990. "Lower plasma–induced damage in $SiO_2$/Si at lower temperatures." Tatsumo Mizutani, Takashi Yunogami and Kazunori Tsujimoto, pp. 1654–1656.

Nuclear Instruments and Methods in Physics Research B13 (1986) "High Kinetic Energy (1–10 eV) Laser Sustained Neutral Atom Beam Source." Jon B. Cross and David A. Cremers pp. 658–662, (month not available).

NASA Tech Briefs, Feb. 1993. "Energetic Atoms Would Etch Photoresists Anisotropically" Lyndon B. Johnson Space Center, Houston, Texas, pp. 86–87.

Paper, Jet Propulsion Laboratory, Pasadena, California. "A Facility For Studies Of Atomic Interactions With Materials." David E. Brinza, et al (date not available).

Journal of Geophysical Research, vol. 95. No. A4, pp. 4147–4153, Apr. 1, 1990 "Infrared Emission From The Reaction Of High–Velocity Atomic Oxygen With Graphite And Polyethylene." K.W. Holtzchaw, et al.

NASA Tech Briefs, MSC–21631 "Energetic Atoms Would Etch Photoresists Anisotropically." (date not available).

American Institute of Physics, "A high–intensiry multi–purpose piezoelectric pulsed molecular beam source" D Proch and T. Tricki, Rev. Sci. Instrum. 60 (4), Apr. 1989, pp. 713–716.

Surface Science Reports 14 161 (1992), H.F. Winters and J.W. Coburn, (month not available).

*Primary Examiner*—Kathryn Gorgos
*Assistant Examiner*—William T. Leader
*Attorney, Agent, or Firm*—Limbach & Limbach L.L.P.

[57] ABSTRACT

An at-least dual chamber apparatus and method in which high flux beams of fast moving neutral reactive species are created, collimated and used to etch semiconductor or metal materials from the surface of a workpiece. Beams including halogen atoms are preferably used to achieve anisotropic etching with good selectivity at satisfactory etch rates. Surface damage and undercutting are minimized.

12 Claims, 9 Drawing Sheets

SEMICONDUCTOR ETCHING BY HYPERTHERMAL NEUTRAL BEAMS

RELATED APPLICATIONS

This is a continuation of application Ser. No. 08/339,072 filed on Nov. 14, 1994, now abandoned, which is a continuation-in-part of application Ser. No. 08/217,683 filed Mar. 25, 1994.

The U.S. Government has certain rights in this invention pursuant to NASA Contract No. NAS 7-1260.

TECHNICAL FIELD

The present invention relates to an apparatus and a method for etching the surface of a semiconductor workpiece, such as a silicon wafer, to define a pattern thereon using a hyperthermal beam of neutral reactive species.

BACKGROUND OF THE INVENTION

A variety of techniques are currently used to transfer lithographically defined patterns to underlying semiconductors for electronic and optoelectronic applications. Such techniques include solvent etching, plasma etching and ion beam assisted etching. Plasma etching processes are the most extensively used of these techniques.

The most commonly used form of plasma etching is reactive ion etching (RIE). However, there is an urgent need for a substantial reduction in energetic ion bombardment damage and charge-induced damage occurring during RIE. While bombardment damage can be reduced by decoupling the plasma generation means from the processing electrode (typically done with new high-density plasma tools), it cannot be completely avoided as this would require a decrease in the translational energy of the ions to below 20 eV, where space-charge repulsion adversely affects directionality. Furthermore, mitigation of charge-induced damage is inherently more difficult because the very nature of plasmas is based on charged particles.

Winters and Coburn have suggested that neutral fluxes of reactive species with excess translational or internal energy, created using supersonic sources, may provide "new and useful etching methods . . . " Winters, et al. *Surface Science Reports* 14 161 (1992). NASA Tech Briefs, February 1993, include a description of the use of atomic oxygen to anisotropically etch photoresists from the surface of semiconductor workpieces, see *Energetic Atoms Would Etch Photoresists Anisotropically,* MSC-21631, the contents of which are incorporated herein by reference.

U.S. Pat. No. 4,894,511 describes an apparatus and method for creating beams of atomic oxygen which are said to be useful for surface erosion, surface coating and the like. Hydrogen, fluorine and chlorine, among others, are mentioned as potentially useful for the same applications. Similarly, U.S. Pat. No. 4,780,608 to Cross et al. describes an apparatus in which laser radiation is used to form a plasma, which, in turn, is used to create a continuous collimated beam of oxygen atoms, in certain cases as mixtures with other gases. This beam is said to be useful for studying the effects of high kinetic energy oxygen atom bombardment on a target material. Each of these patents is also incorporated herein by reference.

Holtzclaw et al., *Infrared Emission From The Reaction of High-Velocity Atomic Oxygen With Graphite and Polyethylene,* J. Geophysical Research, Vol. 95, No. A4, pages 4147–4153, Apr. 1, 1990, describes an apparatus useful for generating a beam of oxygen atoms. This reference is incorporated herein by reference as background to the present invention.

Any barrier to etching could be overcome by sufficient translational energy of the etchant species in the beam. However, if energetic neutral beams are to be useful, the problem of profile control must be solved. Some progress has already been made toward the goal of profile control during etching with neutral beams. Anisotropic etching of semiconductors (Si, GaAs) with a supersonic beam of neutral $Cl_2$ molecules has been demonstrated. In addition, work from the space environmental effects community has shown that a beam of energetic oxygen atoms can etch 0.3 $\mu$m-wide features in an organic polymer with insignificant undercutting. An observation common to both types of etching is the existence of a dependence of the etch rate on initial collision energy. Typically, when energy dependent etching data are fit with an Arrhenius-like expression, activation energies in the range of 0.2–0.4 eV are derived. In the case of silicon etching with $Cl_2$, a threshold to etching of 2.0 eV has been observed. These findings indicate that practical etching with neutral beams may only be achieved with hyperthermal translational energies greater than 2 eV, however, in order to avoid bombardment damage, energies should be kept below the lattice displacement damage threshold, which for silicon is 12.9 eV. The hyperthermal regime of 2–12 eV is not easily accessible.

Conventional supersonic and effusive beam techniques, as well as a laser blow-off technique, have been used to study the interaction of neutral species with semiconductor surfaces. Although these experiments reveal much about the interaction mechanisms under the conditions studied, the practical range of incident-kinetic energies is limited to a few electron volts or less, and the combination of energy and incident flux usually results in too low an etch rate for a study of etch profiles. Furthermore, achievable exposure areas are less than 1 $cm^2$, making it difficult to fabricate even a prototype device for testing.

Thus, a technique is needed not only to accelerate selected neutral species to these kinetic energies but also to generate a collimated beam of these species over an area that would permit fabrication of a real chip (>5 $cm^2$).

SUMMARY OF THE INVENTION

In order to meet this need, the present invention is directed to an apparatus which can be used to anisotropically etch a semiconductor workpiece (e.g. to remove semiconductor and/or oxide layers while avoiding undercutting) using a collimated beam of neutral reactive species. The invention permits the use of such beams to achieve low damage, anisotropic etching, good mask selectivity and practical etch rates.

The apparatus includes a first chamber, means for introducing a reactive species precursor gas into a nozzle in the first chamber, means for inducing the formation of reactive species and hyperthermal expansion of these species from the nozzle, a second chamber, collimation means defining a beam axis between the first and second chambers for collimating a stream of the reactive species passing from the first to the second chamber along the beam axis, and means for creating a low pressure atmosphere in each of the first and second chambers.

In one form of the invention, the reactive species are formed using a pulsed laser, and the collimation means is an orifice positioned between the first and second chambers and centered on the beam axis.

The precursor gas used in the invention may be any one of a number of commonly available gases, preferably halogen containing gases such as $SF_6$, $NF_3$, $F_2$, $CF_4$, $SiF_4$, $BCl_3$, $Cl_2$, $SiCl_4$, HCl, HBr, $Br_2$ and mixtures thereof.

The apparatus according to the invention may also include a shutter which can be used in two preferred modes of operation:

(a) to select a narrow velocity distribution from the broad range of velocities of species passing along the beam path; and (b) block light only, but let species with a broad range of hyperthermal energies pass through.

The invention further includes a method which permits anisotropic etching of semiconductor materials from a semiconductor workpiece using a collimated beam of neutral reactive species. The method includes the steps of introducing a reactive species precursor gas to a gas break-down region of a conical nozzle in a first chamber, inducing gas breakdown into a plasma by exposing the gas to laser radiation, further forcing isentropic expansion of the plasma within the nozzle by further heating the plasma with laser radiation, passing the expanding beam constituents through an orifice into a second chamber and creating low pressure in each of the chambers. The expansion out of the nozzle results in a beam of neutral reactive species moving at hyperthermal velocities. As the beam passes from the first to the second chamber, an orifice or skimmer selects the species moving parallel to the center axis enabling a collimated beam to reach the second chamber.

In one method, the average velocity of the reactive species in the beam is limited from about 2 to about 12 kilometers/second, preferably from about 3 to about 8 kilometers/second. It is especially preferred and advantageous that the collimated beam have a large cross-sectional area, preferably at least four centimeters square. The flux of the collimated beam should be greater than $10^{14}$ atoms/cm$^2$/second. In this method, an in-situ diagnostic for the beam is used so that operation in the 2–12 km/sec range can be achieved and maintained. The diagnostic can be a quadrupole mass spectrometer, which is positioned in a third differentially pumped chamber, connected to the second chamber through a smaller orifice on the beam axis. Thus, the energy and reactive species content of the beam can be monitored and adjusted as necessary.

The method can be applied to selectively etch semiconductor materials including, among others, silicon, $SiO_2$, GaAs, ZnSe, InGaAs, InAlAs, AlGaAs and InP.

BRIEF DESCRIPTION OF THE DRAWINGS

The invention will be better understood by reference to the appended Figures of which.

DETAILED DESCRIPTION OF THE INVENTION

The apparatus and method of the invention will now be described, it being understood that the present invention is not limited to the particular embodiments used to demonstrate and exemplify the invention.

In order to achieve accurately etched circuits on semiconductor workpieces, the invention includes an apparatus and method in which neutral reactive species can be used in the form of a collimated hyperthermal beam. By "hyperthermal" it is meant that the reactive species in the beam are travelling at velocities that are greater than the average velocity in a Maxwell-Boltzmann distribution at room temperature.

The combined aspects of the invention (including, among other features, accelerated reactive species, selected within a specific velocity range, collimated and applied to a workpiece located in a separate chamber under controlled low pressure conditions) permit anisotropic etching of the semiconductor workpieces.

Figure 1:
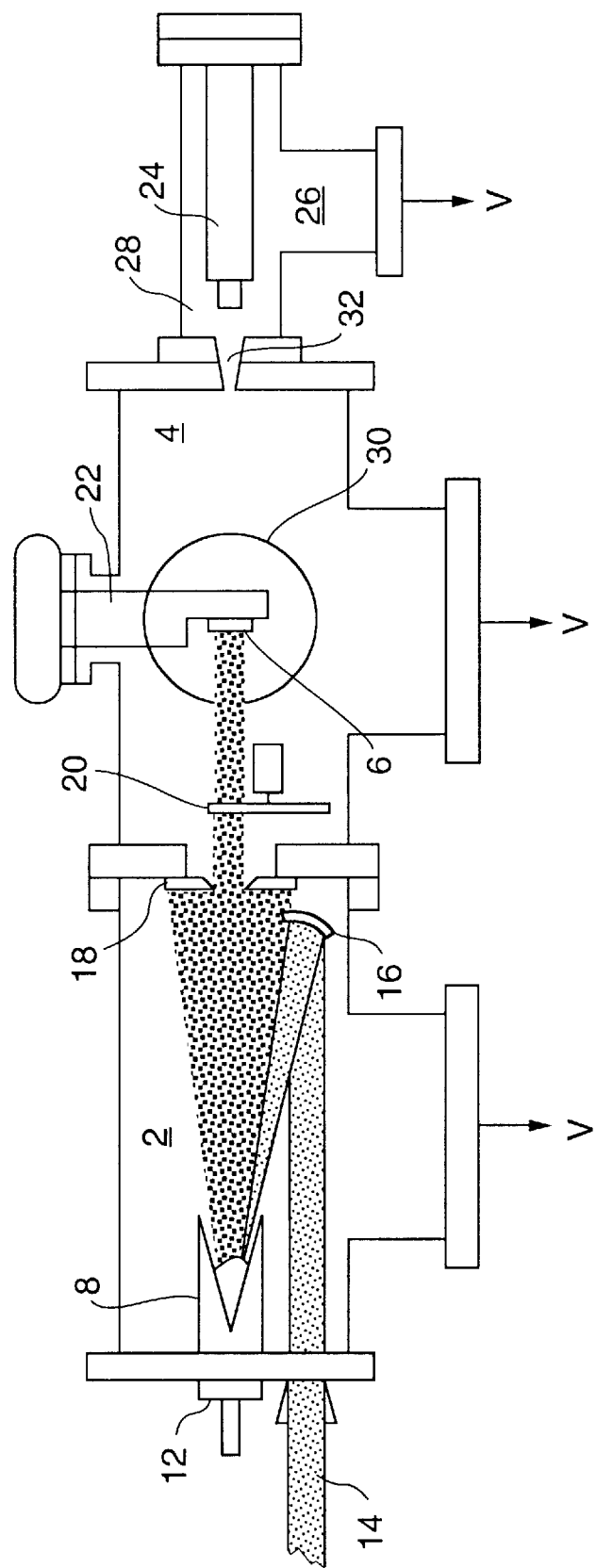
FIG. 1 depicts one form of the apparatus of the invention.

The apparatus of the invention is depicted in FIG. 1, which is a partial cross-section/cut-away view showing the key elements thereof. While the apparatus is novel, those skilled in the art will recognize that the components which make up the invention are known in the art of creating molecular beams. In FIG. 1, each of two vacuum chambers 2 and 4 (each a 10 in ID, 3-way stainless-steel tube) can be evacuated by independently operated vacuum pumps to a low pressure ("V" below each chamber), preferably less than 0.1 and most preferably less than 0.01 mTorr. During the method of the invention, we have found that it is important that the target workpiece be maintained at such low pressures or anisotropic semiconductor etching cannot be achieved. Thus, workpiece 6 is isolated from gas build-up created in chamber 2 by being positioned in independently vacuum pumped chamber 4. In this manner, the shock wave created by the detonation of the precursor gas does not create significant pressure build-up at the working surface, which increases gas-phase scattering, which in-turn adversely affects etching characteristics (more undercutting and lower etch rate).

A nozzle 8 is positioned in chamber 2. A precursor gas or mixture of gases enters nozzle 8 from a precursor gas feed source, such as a gas cylinder, the contents of which are kept at a higher than atmospheric pressure. Generally, halogen-containing gases or mixtures of such gases are preferred for use in the present invention to maximize etch rate. Also mixtures of halogen containing gases with other gases can be useful; as an example, mixing of a fluorine containing gas with $O_2$ will result in formation of $SiO_2$ on the sidewalls during etching of silicon, which typically improves anisotropy.

The use of halogens presents containment difficulties due to the corrosive nature of the plasma formed in the nozzle. However, we have found that the use of a passivation layer on the surfaces of nozzle 8 which are exposed to the plasma results in a structure which is not corroded during operation of the system. The nature of this passivation layer will vary depending on the halogen containing gas used. The use of a copper nozzle in combination with fluorine containing gases is especially advantageous, since a passivation layer is formed on the nozzle surface during the generation of the plasma, and no additional passivation layer need be present prior to installation of the nozzle. Those skilled in the art will recognize that this will not be the case for chlorine containing gases, and it appears that a separately applied passivation layer, for example of nickel, would be needed.

A valve 12 with an orifice face-plate is used to provide pulsed delivery of the precursor gas or gases into conical expansion nozzle 8. Pulsed valves of this type are known in the art as pulsed molecular beam valves. In the preferred embodiment, we used a piezoelectric pulsed molecular beam source identical to the one described by D. Proch and T. Trickl Rev. Sci. Instrum 60, 713–716 (1989) which is incorporated herein by reference. This valve is capable of providing gas bursts as short as 150 microseconds in duration in a very reproducible way. Such control is advantageous, since it is possible to use the amount of gas released into the first chamber as a control parameter in two ways. First, the flux of reactive species carried along the beam subsequently created will be controlled by the amount of the gas present in the throat of the nozzle when the plasma is created, and such flux is a critical parameter for attaining adequate etch rates. We have found that a flux of at least $10^{14}$ atoms/cm$^2$/second is necessary to avoid overly long processing times. Second, the amount of the gas present can be used to control the position of the peak of the energy distribution of reactive species created by the process, as is discussed below with respect to FIG. 2. In this manner, it is possible to select energies (and therefore velocities) which will be optimal for the etching of particular semiconductor materials.

Pulsed laser radiation 14 is employed as a source of energy for breakdown of the gas in nozzle 8, and the radiation is reflected into the cone of nozzle 8 via focussing mirror 16 which is gold-coated, has a $ThF_4$ (thorium fluoride) overcoat, and a 100 cm radius of curvature. In the preferred embodiment a 5 J/pulse $CO_2$ TEA laser can be used, though many other lasers are possible so long as the necessary input energy considerations are taken into account. As the gas is introduced via valve 12 into expansion nozzle 8, incoming laser radiation heats the gas to a very high temperature. The gas breaks down into numerous species such as neutral atoms, gas radicals, electrons and ions, i.e. a plasma. As the plasma expands inside nozzle 8 electrons and ions recombine to form more neutrals, which further expand into chamber 2. This unrestricted expansion results in a hyperthermal beam of neutral reactive species.

Like the volume of gas which is "loaded" into the nozzle, the radiation can be used as a coarse control of the velocity of the reactive species created during the process. As those skilled in the art will appreciate, higher power radiation or longer radiation bursts will produce more highly energetic reactive species.

To isolate the workpiece and collimate the beam, which is critically important to achieving straight sidewall etching, a skimmer orifice 18 is positioned on a surface of first vacuum chamber 2, creating a collimated beam which passes into second vacuum chamber 4. The skimmer orifice 18 is formed of stainless-steel and has a circular cross-sectional opening of approximately 4 centimeters square. For the present apparatus, skimmer orifice 18 is positioned 85 centimeters from nozzle 8. The cross-section of the skimmer-orifice 18 depends on the distance from nozzle 8. The diameter D of the skimmer-orifice opening is related to the distance L from the entrance to the conical nozzle 8 by the formula: $D=2 \cdot L \cdot \tan\phi$ where $\phi$ is the maximum angle permitted between the direction of etching and the center axis of the beam. A typical requirement of $\phi=1.50°$ yields a diameter $D \approx 4.5$ cm for positioning the skimmer-orifice at L=85 cm from nozzle 8. The shape of the skimmer becomes important when operation closer to the nozzle 8 is desired in order to increase the flux of neutral reactive species and achieve higher etch rates. While at 85 cm from nozzle 8 a simple circular orifice between the chambers will be adequate to collimate the beam, at shorter distances a conical skimmer will be required.

For higher etch rates, the collimating system can also be designed to allow the distance from the beam source and the target to be shortened, for example, by having two orifices positioned along the axis between the source and the target and between the first and second chambers. Preferably, the space between the two orifices will also be differentially pumped.

In our preferred embodiment, a motor mounted shutter 20 is positioned along the beam axis in chamber 4 and is employed to select a portion of the reactive species having a particularly desirable, and relatively narrow, velocity range, at the same time screening out unwanted gas breakdown products and radiation. Known delay circuitry referenced to an LED/photodiode sensing system can be used, see for example, the apparatus described in Brinza et al., *A Facility For Studies of Atomic Oxygen Interactions With Materials*, Proceedings of the 3rd International SAMPE Electronics Conference, ed. by S. C. Lockerby, R. Keyson, F. Saremi, T. Visser, La., 1989 which is incorporated herein by reference. The shuttering means used in our invention consists of a Hysteresis Synchronous Motor manufactured by Globe Motors, part #75A1003-2. A wheel called "Photoetched Time-of-Flight Wheel" manufactured by PCM Products, Inc. was attached on the shaft of the motor. The one used for selecting the narrow beam energy distribution was 17.8 cm diam. and 0.005" thick with a slot width of 1/16" and was made of stainless-steel. The wide slot wheel (see FIG. 2) had the same general dimensions with a slot width of 0.4".

Figure 2:
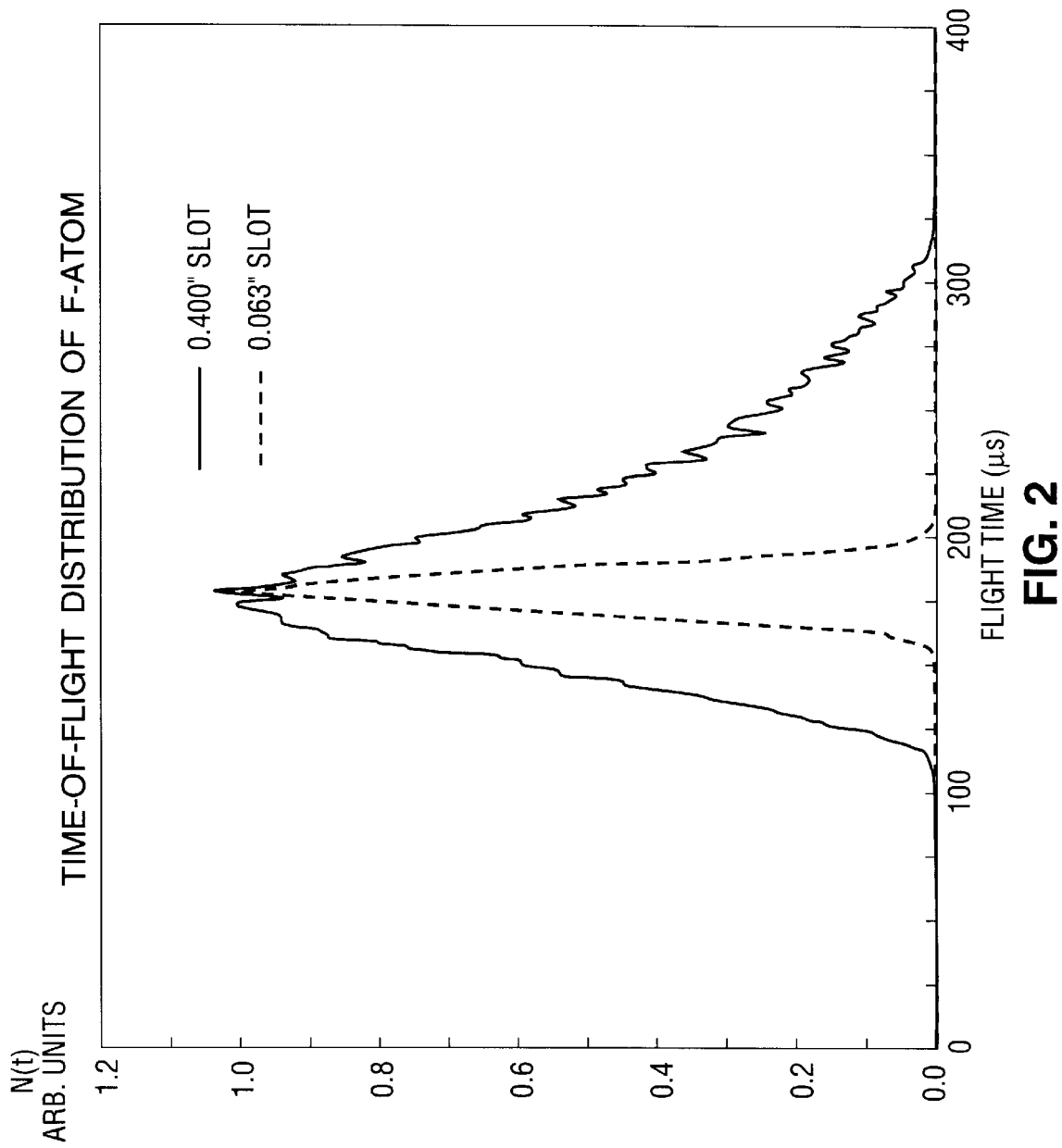
FIG. 2 depicts an example of the time of flight of reactive species such as fluorine atoms generated by the apparatus of the invention, showing the time of flight distribution using two different slot sizes on the shutter.

According to the present invention, a radiation pulse atomizes the precursor gas to form a plasma, with additional energy being incorporated into the reactive species as translational energy. The species created possess a wide distribution of energies, including the preferred hyperthermal range of between 2–12 eV. A typical time-of-flight distribution is shown in FIG. 2, where the number of fluorine atoms arriving in a quadrupole mass spectrometer detector 24 is plotted as a function of the flight time between the firing of the laser pulse and the time of arrival at the detector. The shutter was a chopping wheel with a slot of 0.4". The species velocity can be calculated from this time-of-flight distribution since it is a function of the known nozzle-to-detector distance (126.5 cm) and the time of arrival of the fluorine atoms. By placing a shutter-wheel with a 0.063" slot in the path of the beam and coordinating the opening and closing of the shutter with the laser pulse, it is possible to select a narrow portion of the species having a narrower energy range to pass the shutter. The shutter mechanism thus blocks particles having undesirably low or high energies, as well as blocking unwanted radiation, such as x-rays, VUV radiation and the like, which could damage the target semiconductor material. The shutter also blocks any ion component, which, although small, comes out at the beginning of the pulse. Thus, completely charge-free processing can be realized. The wheel of the shutter can also be used with a wide slit and the appropriate rotation rate to permit the whole beam pulse to pass through while still blocking debris and radiation and any thermal component which can add to undercutting.

Figure 3:
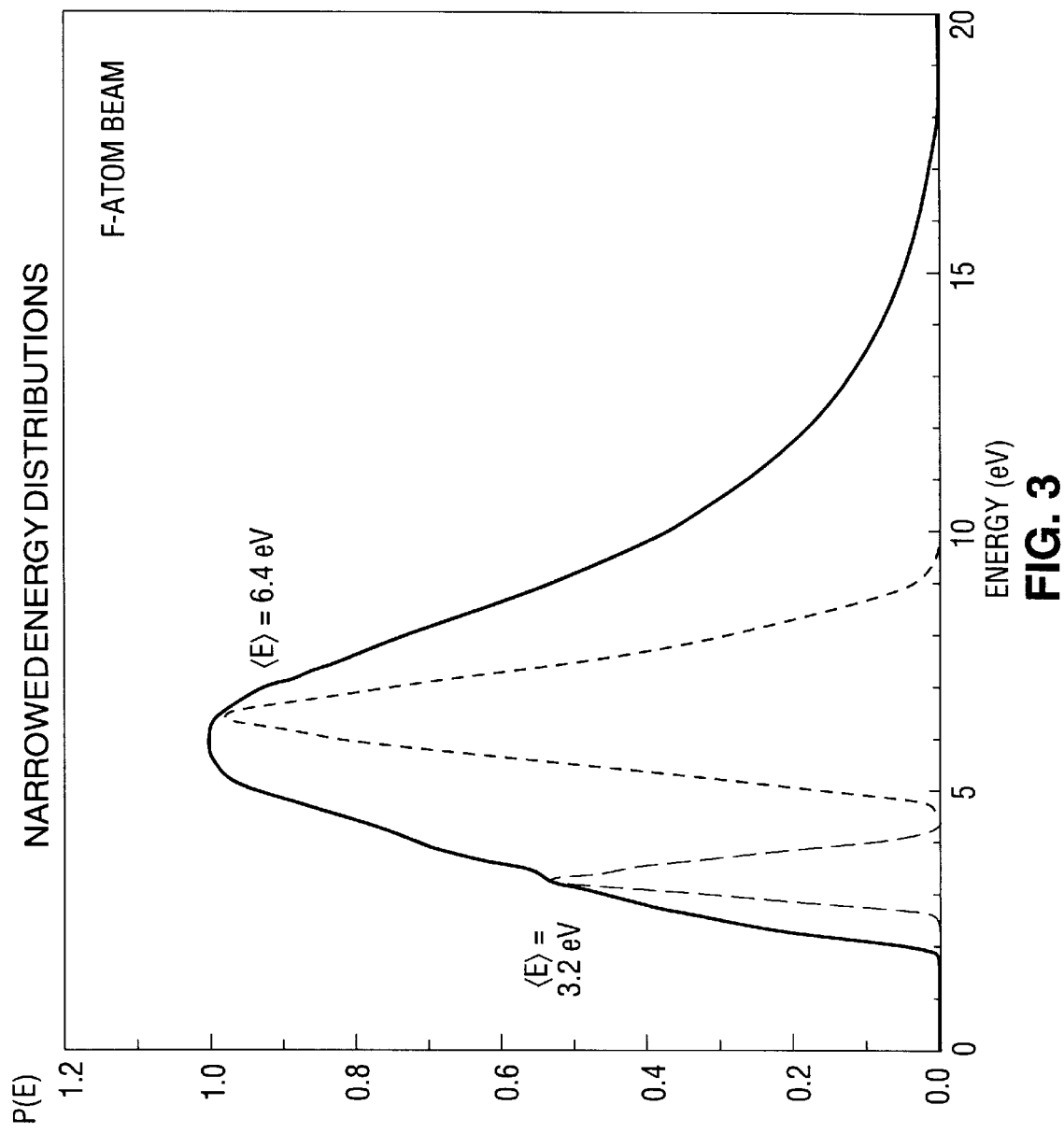
FIG. 3 depicts a broad energy distribution of the beam (solid line), typical of what can be achieved by using the pulsed laser source, and two narrowed energy distributions, selected using the apparatus of the invention.

An indication of the ability of the shutter for use in selecting relatively narrow energy distributions within the broader energy distribution in the beam created is shown in FIG. 3. This figure illustrates the control of the energy of the beam which can be acheived by means of a chopper. The broad energy distribution (solid line) represents what may come out of the beam under a given set of operating conditions. Such a distribution can be narrowed, for example by means of a chopper operating at 260 Hz, having a slot opening of $\frac{1}{16}$ inch. By adjusting the timing between laser firing and the slot opening, any average energy within the broad distibution can be selected. In FIG. 3, distributions for average energies of 3.2 eV and 6.4 eV are shown.

Workpiece 6 is also positioned along the beam axis in a manner such that the surface to be etched intersects with the beam. Circle 30 represents a window useful for viewing the position of workpiece 6. An important advantage of neutral reactive beam etching according to the present invention is the ability to position the target substrate in different orientations to obtain etching in other than perpendicular orientations. To facilitate this, the stage on which the substrate is positioned can be designed to permit such varied positioning and etching at various angles relative to the beam.

It is well known in the art of etching semiconductors that when the reactive species etch the semiconductor material at thermal energies, then cooling of the workpiece is required to eliminate unwanted reactions of the scattered unreacted reactive species at the side walls. The temperature is selected so that the incoming beam of reactive species has kinetic energy high enough to cause etching upon first impingement on the semiconductor surface but the unreacted scattered species have kinetic energies insufficient to cause reaction upon second impingement. A commercially available open cycle cryogenic system such as the LT-3-110 system from APD Cryogenics, Inc. can be used, although those skilled in the art will realize that a less expensive stage with recirculating liquid nitrogen, heating elements and a temperature controller can be easily devised to better fit this particular application.

The apparatus also includes a detector 24, such as a quadrupole mass spectrometer, positioned in a third differentially pumped chamber 26 adjacent to chamber 4, so that the ionizer 28 is exposed via opening 32. Cryogenic stage 22 will be removed from the beam path to permit the beam to reach the spectrometer, enabling calibration and monitoring. The time of arrival of the reactive species is monitored and a time-of-flight distribution is obtained. The instrument used employs a home-built Brink-type ionizer coupled to a quadrupole mass filter manufactured by EXTREL, followed by a DALY-type ion counter. A complete commercial EXTREL Molecular Beam Mass Spectrometer with an axial ionizer, available from Extrel Corporation could be used instead. Our ionizer was triply-differentially pumped (see FIG. 6) and the complete Mass Spectrometer was rotatable about the position of the workpiece, which allows for in-situ monitoring of the etching process.

High fidelity etching requires a high degree of etch selectivity between the protective mask and the material being etched as well as between the material being etched and the underlying material. Controlling the energy range, and therefore velocity, of the reactive species allowed to impact the material being etched may reduce inelastic scattering and therefore the ultimate quality of the etching. We have found that for the etching of a silicon wafer partially covered by a photoresist mask, the use of the device and method of the present invention results in virtually no erosion of the mask, demonstrating a high degree of selectivity.

For room temperature etching, we have achieved etch selectivity of 30:1 between Si and $SiO_2$ using $SF_6$ as a precursor gas feed to produce a beam of fluorine atoms having a peak energy of 4.8 eV. This represents a significant improvement over reactive ion etching procedures which generally have an etch selectivity of about 10:1 for room temperature etching in fluorine only containing plasmas. For 1.4 hertz operation, etch rates of 300 angstroms per minute with 4.8 eV average energy fluorine atoms, at a source/target distance of approximately 30 cm were achieved. A 5 Joule/pulse $CO_2$ TEA laser was used in all experiments.

It is believed that the use of the invention can result in elimination of bombardment damage due to the regime of energies achieved (2–12 eV for fluorine atoms), minimization of mask erosion and elimination of undesirable etching characteristics attributed to etching with ions, such as side wall bowing and microtrenching. The use of a separate vacuum system in the invention for second vacuum chamber 4 also minimizes effects due to pressure build-up near the surface of the etched workpiece. Such effects include enhanced gas-phase scattering of the incoming reactive species that result in beam collimation loss and slower evacuation of etching reaction by-products from the holes created on the workpiece, which results in isotropic etching.

Figure 4:
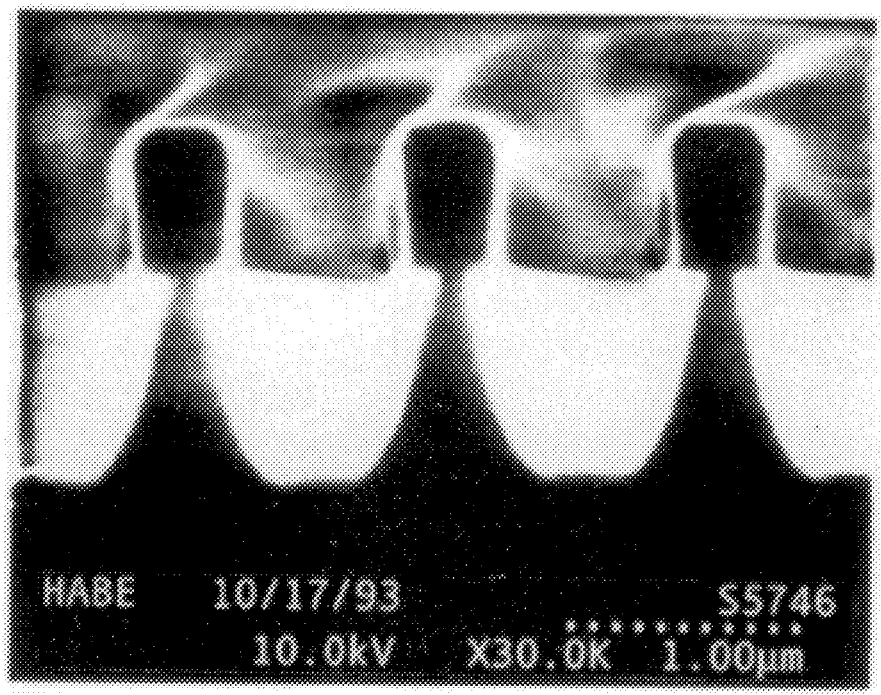
FIG. 4 is a scanning electron micrograph of the cross-section of a silicon wafer etched using one method and apparatus of the invention.
Figure 5:
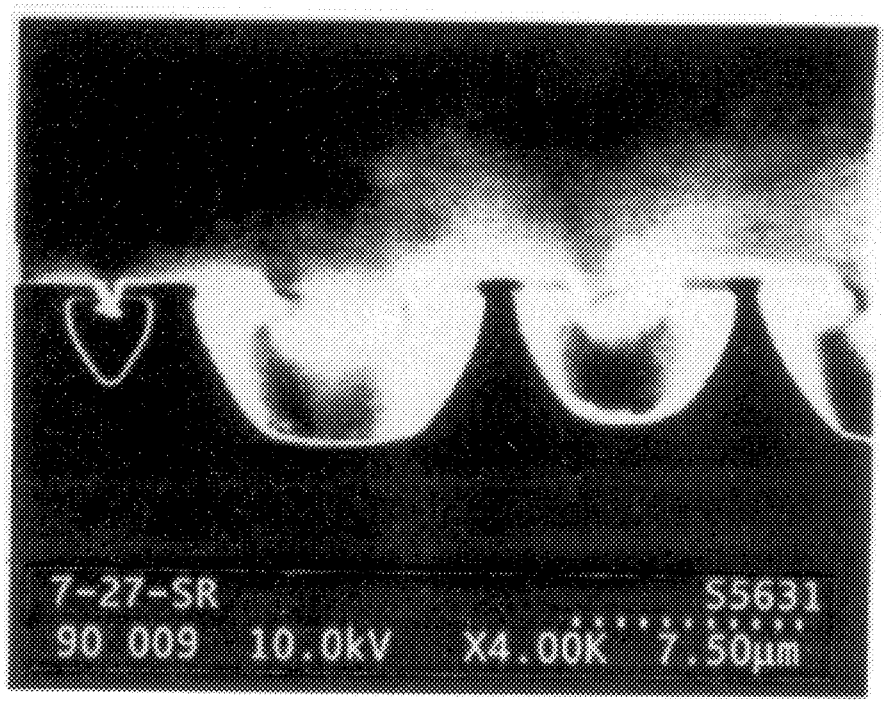
FIG. 5 is a scanning electron micrograph of the cross-section of a silicon wafer etched in the first chamber, showing the adverse effects of the pressure wave.

FIGS. 4 and 5 highlight the advantages of using the apparatus and method of the invention. FIG. 4 is a scanning electron micrograph of the actual etch results achieved by the invention. A silicon wafer was masked by a trilayer lithographic technique, the top two layers were then removed by etching in a Reactive Ion Etching apparatus defining the slightly trapezoidal top features consisting of Novolac resist. The wafer was then placed in chamber 4, positioned perpendicular to the direction of the beam at approx. 92 cm away from the apex of the conical nozzle. A pulse of $SF_6$ was launched through valve 12 in the conical nozzle 8 and 250 $\mu s$ later a 5 Joule $CO_2$ TEA laser pulse was focussed at the nozzle throat. This resulted in a beam of fluorine atoms having an average translational energy of 4.8 eV. No shutter was used and therefore the workpiece was exposed to the entirety of the beam. A circular orifice of 25.4 mm diameter was used between chambers to collimate the beam. The workpiece was etched for 80,000 beam pulses fired at a rate of 1.4 Hertz.

Referring again to FIG. 4, the features were approximately 0.4 $\mu m$ in size and were etched to a depth of 0.9 $\mu m$. 14% undercutting was seen for room temperature etching. Undercutting is expected due to the high reactivity of the fluorine atoms that scatter inelastically from the etched surface and reach the side walls (see examples below). Cooling of the silicon workpiece to between −50 and −100° C. is expected to eliminate the undercutting. Operation with chlorine atoms at room temperature is also expected to improve anisotropy as is well known to reactive ion etching practitioners in the field.

FIG. 5 illustrates the etching obtained when placing the workpiece in the first chamber at approximately 45 cm from the apex of the conical nozzle in the central part of the beam. The 0.4 $\mu$m features totally collapsed for etching to the same depth (not shown). The 5 $\mu$m features shown have been undercut by 50%. The substantial loss of anisotropy, as compared to the results of FIG. 4, is believed to be due to the higher pressure near the surface of the wafer in chamber 2. When only the central part of the beam is selected and a separate differentially pumped chamber is used, the gas loading is negligible and pressure effects are not observed. Another effect of the substantial increase in pressure on the surface of the workpiece is observed in FIG. 5. When the spacing between adjacent features of the mask is small, the conductance is also small. Then, for a given pressure gradient between the top and the bottom of a hole, the etching reaction by-products cannot be easily pumped out from the small hole. Since these gaseous species remain longer in the small hole, gas-phase collisions impede the newly arriving reactive species from reaching the bottom and causing etching. This is why the small hole at the left of FIG. 5 has been etched to a substantially lesser depth than the larger hole next to it.

EXAMPLES

A series of experiments were run using a pulsed beam of hyperthermal fluorine atoms with an average translational energy of 4.8 eV to demonstrate anisotropic etching of Si. In summary, for 1.4 Hz operation, a room temperature etch rate of 300 Å/min for Si(100) has been measured at a distance of 30 cm from the source. A 14% undercutting for room temperature etching of Novolac-masked Si features was achieved with a highly-collimated beam under single-collision conditions. Translational energy and angular distributions of scattered fluorine atoms during steady state etching of Si by a normal-incidence, highly-collimated beam demonstrate that unreacted F atoms can scatter inelastically, retaining a significant fraction of their initial kinetic energies. The observed undercutting can be explained by secondary impingement of these high energy F atoms, which are more reactive upon interaction with the sidewalls than would be expected if they desorbed from the surface at thermal energies after full accommodation. Time-of-flight distributions of volatile reaction products were also collected, and they show evidence for at least two distinct reaction mechanisms of the incident atoms with the surface.

A. BEAM GENERATION AND CHARACTERIZATION

Figure 6:
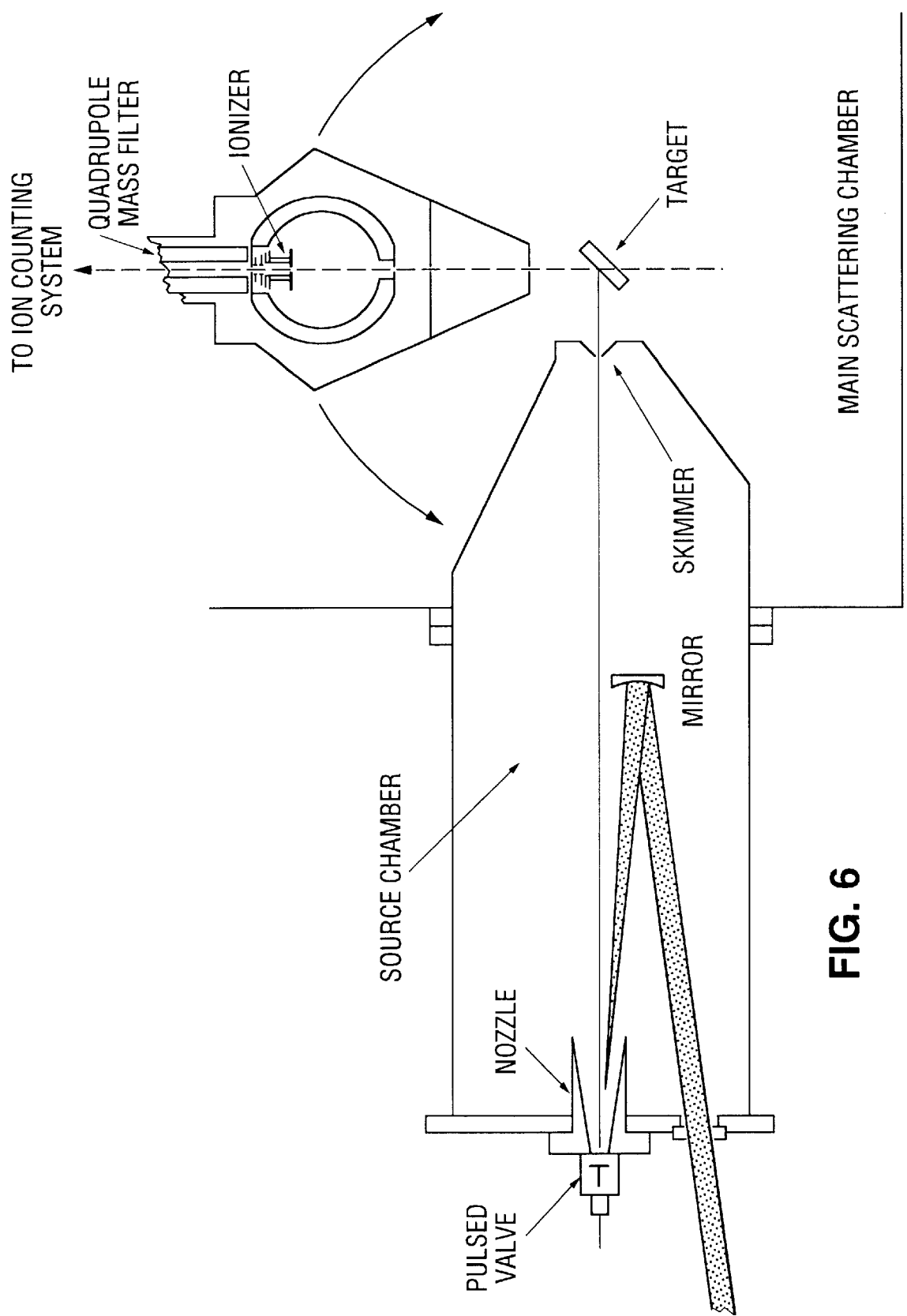
FIG. 6 is a schematic depiction of the hyperthermal atom beam source, the differentially pumped scattering region and the rotatable quadruple mass spectrometer detector used as disclosed in the Examples.

Neutral beam etching studies are based on the coupling of a fast-atom beam source with a crossed molecular beams apparatus. FIG. 6 shows a schematic diagram of the essential elements of the apparatus. A pulsed beam of energetic atoms with velocities in the range 4–11 km/s is directed at a target, which can be placed at a variety of distances from the source. At one of the target positions, 92 cm from the apex of the conical nozzle source, the target and a mass spectrometer detector can be rotated about the same axis; therefore, inelastic and reactive species emerging from the target surface during etching can be detected, and the velocities and intensities of these volatile species can be measured as a function of incident and final scattering angles $\theta_i$ and $\theta_f$. The detector can also be positioned such that the detection axis coincides with the beam axis in order to determine the species in the beam and their velocities.

Figure 7A:
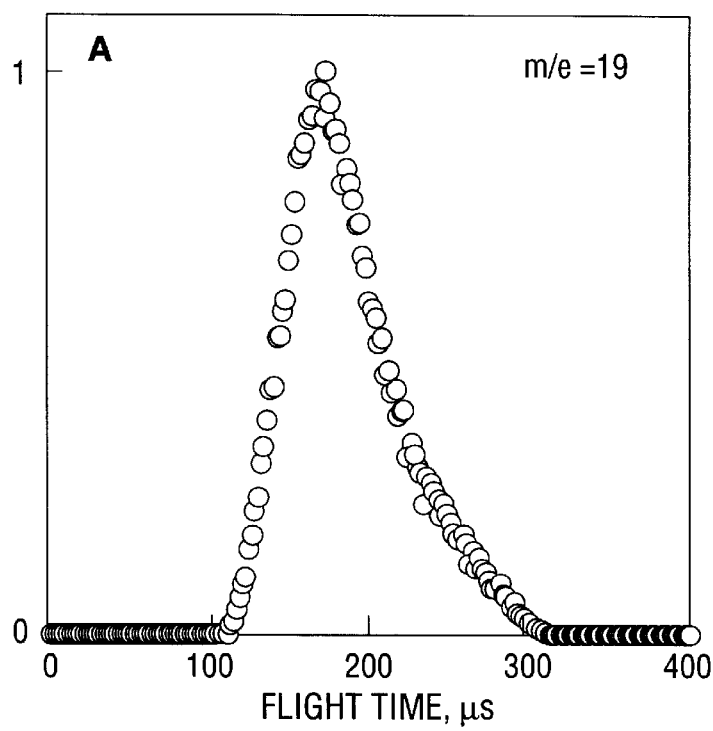
FIG. 7A shows a beam time-of-flight distribution (corrected for ion flight time) collected at m/e=19 ($F^+$), where time zero corresponds to the firing of the laser pulse.
Figure 7B:
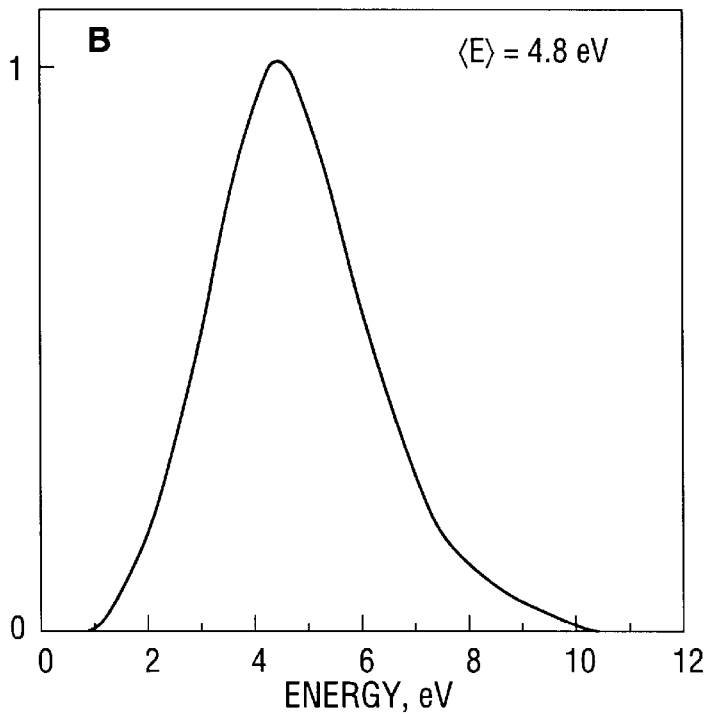
FIG. 7B shows the translational energy distribution of F-atoms in beam, derived from the TOF distribution in A.

The beam source is based on the laser detonation source described in U.S. Pat. No. 4,894,511 to Caledonia et al. We focus the light pulse from an Alltec Model 851 $CO_2$ TEA laser into a 10 cm long, watercooled copper nozzle by means of a gold mirror placed 50 cm from the apex of the cone. A home-built piezoelectric pulsed molecular beam valve is used to inject pure $SF_6$ gas, at a stagnation pressure of 125 psig, into the nozzle cone through a 1 mm dia. orifice at the apex. The $SF_6$ gas is atomized in the laser-induced plasma, and, following electron-ion recombination in the expanding, high-density plasma, a nominally neutral beam of high-velocity atomic fluorine and sulfur emerges. The beam has a nominal direction, determined by the 20° full included angle of the conical nozzle; however, the beam can be highly collimated with the use of an aperture. We estimate the F-atom beam flux on axis 30 cm from the nozzle apex to be approximately $2 \times 10^{15}$ atoms/cm$^2$/pulse. This estimate is based on a comparison of F-atom signal intensity registered at m/e=19 with the 0-atom intensity (m/e=16) from a beam of hyperthermal atomic oxygen whose flux was calibrated from an erosion measurement of Kapton polyimide polymer, which has a known reactivity of $3 \times 10^{-24}$ cm$^3$/atom. Because the beam flux is proportional to the inverse square of the distance from the source, the estimated F-atom flux at the position of the detector rotation axis is $2 \times 10^{14}$ atoms/cm$^2$/s. The translational energy distribution of the fluorine atoms in the beam has been derived by measuring the arrival times of the fluorine atoms that travel 126.5 cm from the nozzle to the detector ionizer following the laser detonation pulse. The beam TOF distribution N(t), collected at m/e=19 with the mass spectrometer directly viewing the beam, is shown in FIG. 7A. FIG. 7B shows the translational energy distribution P(E), derived with the relationship $P(E) \propto t^2 N(t)$. The average translational energy of the beam was 4.8 eV, and the energy spread (FWHM) was approximately 3.0 eV. The respective quantities for the sulfur component of the beam were 8.2 eV and 5.5 eV. While these beam characteristics apply to the experiments described here, the average kinetic energy of the beam can be varied easily over the range 3–7 eV by adjusting the valve-laser timing and the stagnation pressure of the gas behind the nozzle.

Figure 8:
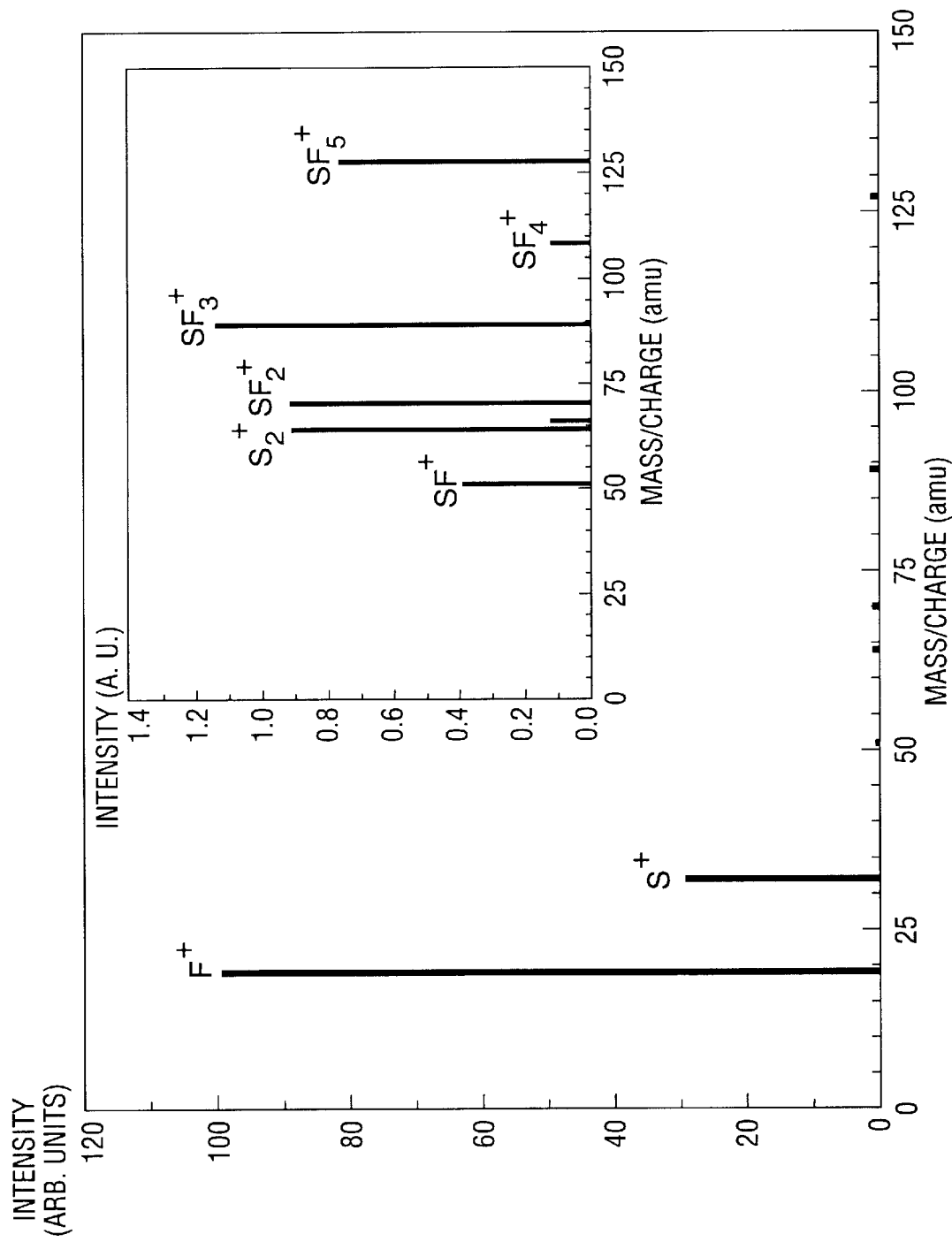
FIG. 8 shows the mass spectrum of a hyperthermal beam obtained from integrated beam TOF distributions.

The beam composition was completely characterized by collecting TOF distributions at all masses that showed beam-modulated signal. The mass spectrum, shown in FIG. 8, demonstrates that the beam consists almost entirely of atomic fluorine and sulfur. The relative ion content of the beam was determined to be negligible by comparing the signals at various masses with the ionizer turned on to those with the ionizer turned off. At m/e=19, the integrated signal with the ionizer off dropped to less than one percent of the value measured with the ionizer on. We concluded that the ion fraction in the beam must have been <<1% because neutrals are ionized with an efficiency of about $10^{-4}$ in our modified Brink-type ionizer.

Two types of experiments were performed with the hyperthermal beam described above. Masked, semi-insulating silicon wafers, kept at room temperature, were etched in the beam path at distances of 30 and 92 cm from the nozzle apex, and TOF distributions of products scattered inelastically and reactively from an n-type, epitaxial Si(100) surface (held at 345 K and situated 92 cm from the source) were monitored at a variety of incident and final angles, after a steady-state condition (as determined from the reproducibility in the shape of the TOF distributions) had been reached.

The sample cleaning procedure involved degreasing for 10 min in boiling trichloroethylene followed by 10 min in boiling ethanol (200 proof USP), a dip in nanopure $H_2O$ followed by etching for 15 sec in conc. HF (49%), a rinse in nanopure $H_2O$, and finally a dip in boiling ethanol. The sample was transferred in air to the scattering chamber. The masked Si wafer was produced by trilayer photolithography. The remaining mask on the wafer consisted of Novolac photoresist and was defined by etching in an oxygen plasma. The trenches did not clear thoroughly, and a sharp edge of resist could be seen in SEM pictures of the wafer ("reentrant" mask).

At the 92 cm nozzle-surface distance, the beam was collimated as a result of its passage through a 25.4 mm dia. orifice (etching experiment) or a 3 mm dia. orifice (scattering experiment) placed 85 cm from the nozzle apex. The aperture was the dividing line between two differentially-pumped regions of the apparatus. The source chamber, pumped by a 10" diffusion pump with an ethanol-cooled baffle kept at $-27°$ C., had an ultimate pressure of $2 \times 10^{-6}$ Torr and went up to approximately 1 mTorr during the beam pulse. The main scattering chamber was pumped by two 10" cryopumps and had an ultimate pressure of $1 \times 10^{-7}$ Torr. The pressure in this chamber rose to $2 \times 10^{-6}$ Torr during the beam pulse with the larger aperture and $2 \times 10^{-7}$ Torr with the smaller aperture. Typical counting times for the TOF distributions of scattered species were 200–1000 pulses, while 81,000 pulses were used to etch the wafer at the 92 cm position. A variety of exposure durations, all <80,000 pulses, were used to etch wafers at the 30 cm position. The time resolution of the TOF distributions was determined by the width of the incident beam pulse. The TOF distributions presented have been corrected for the ion flight time in the detector $(2.3 \ (m/e)^{1/2} \ \mu s)$.

During the scattering experiments, no $SiS_x$ products were detected in the mass spectrometer. Furthermore, after the experiment, the etched surface was examined by X-ray photoelectron spectroscopy after air transfer, and no sulfur was detected. Therefore, we concluded that sulfur atoms did not react with the surface. Their role in etching due to energy transfer during bombardment of the surface might, however, be important.

B. ETCHING RESULTS

Figure 9:
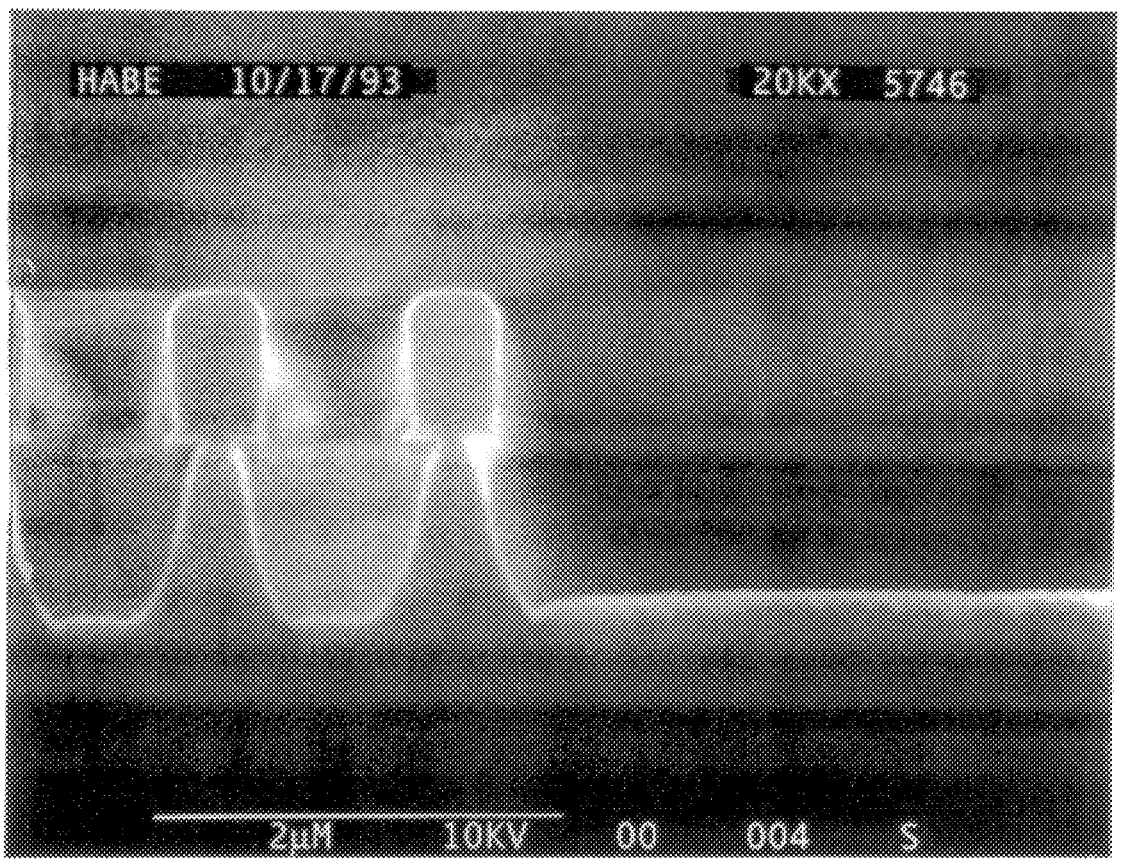
FIG. 9 shows a SEM cross-sectional view of trenches in Si etched by the hyperthermal neutral F atom beam to a depth of approximately 0.9 $\mu$m, where re-entrant mask shape is due to mask definition in an oxygen plasma and no mask erosion occurred during the hyperthermal beam processing.

The scanning electron micrograph (SEM) in FIG. 9 shows a cross-sectional view of trenches that were etched into a masked Si wafer placed 92 cm from the nozzle. The shape of the mask was a result of incomplete clearing in an oxygen plasma; no observable alteration (erosion, sputtering) of the mask occurred even after etching to a depth of 5 $\mu$m. The room temperature etch rate observed at the 92 cm position was 10 Å/min. The profiles were undercut by 14%, which is comparable to what is expected and seen in RIE of Si at room temperature with fluorine-based chemistry and no simultaneous deposition on the sidewalls. We also observed features typically seen in RIE profiles, such as microtrenching and dovetailing; however, in contrast with typical RIE profiles, the features in FIG. 9 also exhibit "inverse microloading," or a higher etch rate between two features than in an open area away from masked features. The surface appearance after etching was rough (grainy) with an average feature size of approximately 50 Å for an etch depth of 1 $\mu$m. We have also etched the same structures without beam collimation at a distance of 30 cm from the source, where the profiles (see FIG. 5) were undercut by 50% but with an etch rate of 300 Å/min, more than would have been expected by the inverse square dependence on the flux. This unexpectedly high etch rate might arise from a non-linear flux dependence and/or a high ambient F-atom pressure in the source chamber during the pulse.

The origin of the undercutting is important because of its implications for anisotropic etching by directed fast neutral beams and also because of its relevance to RIE. In our experiment, the undercutting at the 92 cm position was noteworthy because the beam of neutral F atoms was highly collimated and interacted with the Si surface under very low pressure conditions. In RIE profiles, undercutting has been commonly attributed to thermal desorption and surface diffusion of unreacted fluorine atoms from the bottom of the trenches. These atoms are assumed to reach the sidewalls and react even at room temperature. Using this assumption, Singh et al. (V. K. Singh, E. S. G. Shaqfeh, and J. P. McVittie, J. Vac. Sci. Technol. B 10, 1091 (1992)) have modeled the profile evolution during RIE in an $SF_6$ plasma. They found that surface diffusion would require an unreasonably long time scale in order to be an important mechanism in profile evolution. Indeed, they were able to predict etch profiles by considering contributions from thermal desorption alone. Their simulation was based on a fit of one experimental profile which determined the value of the sticking coefficient as well as the neutral-to-ion flux ratio on the etched surface. This fitting procedure resulted in a very low sticking coefficient of 0.01 and led to the conclusion that, in order to predict the substantial undercutting, a very large number of unreacted fluorine atoms must leave the surface at thermal energies. A sticking probability of 0.01 is expected when spontaneous etching takes place; ion bombardment facilitates a reduction in surface coverage which in turn leads to an increased sticking probability. An alternative explanation suggests that this unrealistic modeling result for the highly reactive F+Si system may be unnecessary. The undercutting may arise from a lower flux of unreacted fluorine atoms which have higher translational energies than expected from a Maxwell-Boltzmann distribution and are, therefore, more reactive upon impact with the sidewalls. Higher translational energies could result from inelastic scattering, a process which has not been considered before in relation to etching.

C. SCATTERING DYNAMICS

Figure 10:
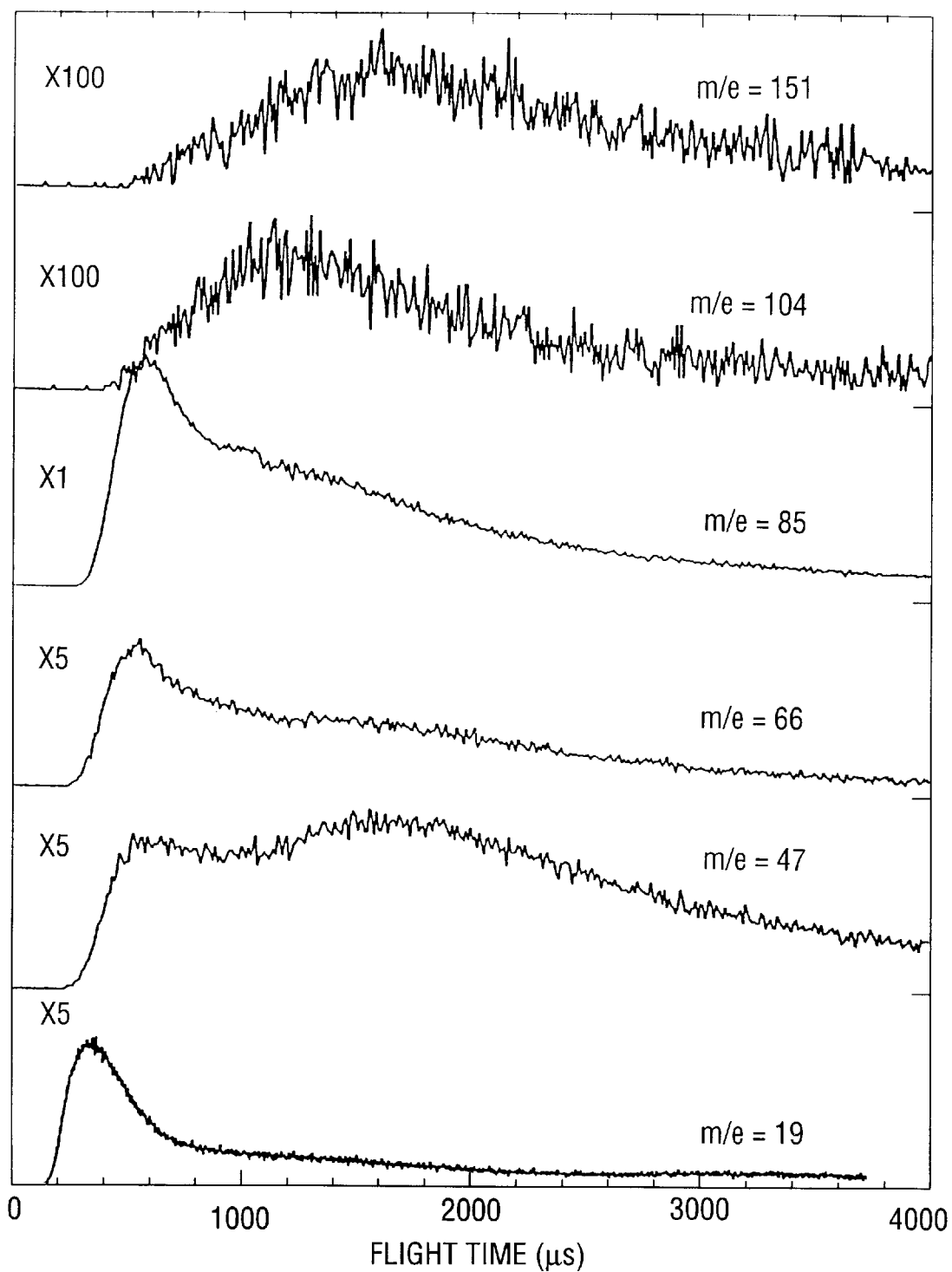
FIG. 10 shows time-of-flight distributions (corrected for ion flight time) of inelastically scattered fluorine (m/e=19) and reactive products detected at the various m/e ratios indicated, taken for the incident angle $\theta_i=0°$ and exit angle $\theta_f=47°$ and surface temperature of 345 K, where time zero corresponds to the firing of the laser pulse.

FIG. 10 shows a representative set of TOF distributions taken at $\theta_i=0°$ and $\theta_f=47°$ for five masses corresponding to reactive products and one mass corresponding to inelastic scattering of F-atoms. The scattered fluorine atoms have translational energies substantially higher that those expected from a Maxwell-Boltzmann distribution. The m/e= 19 TOF distribution of FIG. 10 implies a peak translational energy of 0.32 eV for the scattered F-atoms exiting at $\theta_f=47°$. This value increases to 0.38 eV for F-atoms scattered at of $\theta_f=62°$, the largest exit angle monitored for a normal incidence beam. The surface temperature would have to be between 2500–3000 K in order to impart desorbing atoms with kinetic energies in this range. The surface was, in fact, kept at 345 K during the interaction. Furthermore, the shape of all m/e=19 TOF distributions indicates that the velocity distribution of F-atoms emerging from the surface is not Maxwell-Boltzmann. Finally, the angular distribution of scattered F atoms is not cosine, as would be expected for thermally desorbed F-atoms. Therefore, fluorine atoms must scatter inelastically from the surface, retaining a fraction of their incident energy.

Although the initial interaction results in three dimensional scattering, the TOF distributions of FIG. 10 give an idea of the relative magnitude of the F-atom signal in the scattering plane. When converted to a flux distribution from a number density distribution $(I(t) \propto N(t)/t)$ and corrected for relative ionization cross-sections and number of fluorine atoms in each detected species, the TOF distributions reveal that the flux of inelastically scattered F-atoms is roughly 65% of the flux of reactive products exiting the surface at $\theta_f=47°$. Other combinations of incident and final angles also show substantial scattered flux of unreacted F-atoms in the scattering plane. Our preliminary experimental observations therefore support the conclusion that undercutting comes from secondary impingement of energetic fluorine atoms which scatter inelastically upon initial impact with the fluorinated Si surface. If the impinging F-atoms encountered a virgin Si surface or one with a reduced surface coverage, they would be more likely to react, and undercutting resulting from inelastic scattering would be diminished.

The TOF distributions of the reactive products detected at m/e=85, 66, 47 are bimodal, suggesting that at least two interaction mechanisms with the surface lead to ejection of volatile reaction products. The slower component (longer arrival times) at each mass can largely be explained by ionizer fragmentation of heavier products which are traveling at velocities corresponding to the surface temperature. For example, the slow component of the m/e=85 ($SiF_3^+$) TOF distribution has approximately the same arrival time and shape as the m/e=104 ($SiF_4^+$) TOF distribution. This observation is consistent with the conclusions of earlier experiments that $SiF_4$ products exit the surface at thermal energies and fragment in an ionizer to give a dominant mass peak at m/e=85. The fast, or hyperthermal, component (short arrival times) at m/e=85 has no corresponding peak at m/e=104 or 151 (heavier products were not detected). Unless a product heavier than 85 amu happens to exit the surface at hyperthermal velocities and fragment much more in the ionizer than the same product at thermal velocities, then the hyperthermal component at m/e=85 must originate from an $SiF_3$ reaction product. Our preliminary experiments show dependencies of the hyperthermal signal at m/e=85 on incident energy, incident flux, surface temperature, and incident and final angles that implicate collision-induced desorption as the source of the hyperthermal products. The hyperthermal signal seen at lower masses may come from a combination of ionizer fragmentation of $SiF_3$ and direct ejection of $SiF_2$ and SiF products by collision-induced desorption or another mechanism. It should be noted that the existence of a collision cascade mechanism in connection with ion assisted etching has been reported and debated in the literature. Although not typically observed, a collision-induced desorption process could be important in the regime of high incident energy and flux, where we are studying neutral beam etching.

D. SUMMARY AND CONCLUSIONS

A neutral beam of hyperthermal fluorine atoms, produced by laser detonation of $SF_6$ and possessing an average translational energy of 4.8 eV, has been used to etch sub-micron features in silicon. We observed 14% undercutting for etching at room temperature and concluded from scattering experiments that the undercutting resulted largely from fluorine atoms scattering inelastically from the fluorinated silicon surface. Angle- and velocity-resolved measurements demonstrated that fluorine atoms can retain a fraction of their incident energy even after head-on collisions with the etched surface and suggest that secondary impingement of energetic etchant species should be included in modeling studies of profile evolution. A significant flux of energetic reaction products (e.g. $SiF_3$) might also need to be considered as a source of undercutting if they themselves are reactive. Finally, some TOF distributions of reactive products are bimodal, suggesting the existence of two reaction mechanisms, one of which may be collision-induced desorption.

This experiment implies that improved anisotropy will be achieved by reducing the reactivity and flux of scattered reactive species. Approaches that can be considered include: a) increasing the mass of the etchant species to enhance energy transfer during the initial interaction so that inelastically scattered species carry less energy to the sidewalls, b) increasing the reactivity during the first encounter of the etchant species with the surface so that the flux of the scattered reactive species is reduced, c) reducing the surface temperature so that the energy of the scattered species is not enough to facilitate reaction at the sidewalls, d) reducing the translational energy of the incident beam in order to lower the energy of the scattered reactive species, and e) choosing an etchant species that requires more translational energy to react.

While the present invention is disclosed by reference to specific embodiments, it is to be understood that these embodiments are intended in an illustrative rather than limiting sense, as it is contemplated that modifications will readily occur to those skilled in the art, within the spirit of the invention and the scope of the appended claims. For example, the apparatus and method could readily be modified for use in etching polymeric films (e.g. polyimides) as well as for etching metal films (e.g. tungsten, aluminum, copper and others). Such films find application in interconnect technology.

We claim:

1. A method of etching a surface of a semiconductor workpiece using a collimated beam of neutral reactive species comprising the steps of:

introducing a precursor gas comprising a halogen, a halogen-containing gas or a mixture of these gases to a nozzle in a first chamber in a pulsed flow using a pulsed molecular beam valve;

generating a hyperthermal plasma flow from the precursor gas within said first chamber by exposing said precursor gas to pulsed laser radiation, the plasma flow including neutral reactive species having a first distribution of translational energies;

controlling a velocity of said neutral reactive species by varying a rate at which the pulsed molecular beam valve introduces the pulsed flow into the first chamber;

collimating said plasma flow by passing said plasma flow through an orifice thereby creating a collimated beam;

passing said collimated beam to a target chamber containing the semiconductor workpiece;

selecting a portion of the neutral reactive species having a second distribution of translational energies, wherein the second distribution is narrower than the first distribution, by positioning a beam shutter in the path of the collimated beam and coordinating the opening and closing of the shutter with the pulsed laser;

creating and separately controlling low pressure in each of said chambers; and etching the surface of the semiconductor workpiece in the target chamber.

2. A method according to claim 1 wherein the distribution of translational energies is in the range of about 3 to about 7 eV.

3. A method according to claim 1 wherein said precursor gas comprises a member of the group consisting of $SF_6$, $NF_3$, $F_2$, $CF_4$, $SiF_4$, $BCl_3$, $Cl_2$, $SiCl_4$, HBr, HCl, $Br_2$ and mixtures thereof.

4. A method according to claim further comprising the step of controlling a peak velocity of said neutral reactive species by varying a power of the laser radiation to which said precursor gas is exposed.

5. A method according to claim 1 comprising the further step of characterizing the composition and energy distribution of the beam.

6. A method of etching the surface of a semiconductor workpiece using a collimated high-flux beam of neutral reactive species comprising the steps of:

introducing a pulsed flow of a precursor gas comprising a halogen, a halogen containing gas or a mixture of these gases to a nozzle in a first vacuum chamber, wherein the pulsed flow of the precursor gas is about 150 microseconds in duration;

exposing said precursor gas to pulsed laser radiation to atomize said precursor gas and hyperthermally accelerate halogen atoms from said nozzle to form a beam of atoms having a distribution of translational energies including about 2 to about 12 eV, along a beam axis;

controlling the velocity of said accelerated atoms in said beam by positioning a beam shutter along the beam axis and coordinating the opening and closing the beam shutter with the pulsed laser, to select a distribution of translational energies of from about 2 to about 12 eV;

creating a collimated beam of said atoms having a cross-sectional area at least 4 centimeters square and a flux greater than $10^{14}$ atoms/cm$^2$/second by passing said beam through a collimating passage between said first vacuum chamber and a target vacuum chamber; and applying said collimated beam to a target semiconductor workpiece in said target vacuum chamber to etch a surface of said workpiece.

7. A method according to claim 6 wherein said surface to be etched is a member of the group consisting of silicon, $SiO_2$, GaAs, ZnSe, InGaAs, GaAlAs, InP and InAlAs.

8. A method according to claim 6 wherein said surface to be etched comprises a metal film.

9. A method according to claim 8 wherein said metal film comprises a member selected from the group consisting of copper, aluminum and tungsten.

10. A method according to claim 6 wherein said target workpiece is positioned at an angle relative to said beam to permit etching at angles other than normal incidence.

11. A method of etching a surface of a semiconductor workpiece using a collimated beam of neutral reactive species comprising the steps of:

introducing a precursor gas comprising a halogen, a halogen-containing gas or a mixture of these gases to a nozzle in a first chamber in a pulsed flow using a pulsed molecular beam valve;

generating a hyperthermal plasma flow from the precursor gas within said first chamber by exposing said precursor gas to pulsed laser radiation, the plasma flow including neutral reactive species having a first velocity range;

controlling a velocity of said neutral reactive species by varying a rate at which the pulsed molecular beam valve introduces the pulsed flow into the first chamber;

collimating said plasma flow by passing said plasma flow through an orifice thereby creating a collimated beam;

passing said collimated beam to a target chamber containing the semiconductor workpiece;

selecting a portion of the neutral reactive species having a second velocity range, wherein the second velocity range is narrower than the first velocity range, by positioning a beam shutter in the path of the collimated beam and coordinating the opening and closing of the shutter with the pulsed laser;

creating and separately controlling low pressure in each of said chambers; and etching the surface of the semiconductor workpiece in the target chamber.

12. A method according to claim 11 wherein the second velocity range is from about 3 to about 8 kilometers per second.

* * * * *